(12) United States Patent
Kamo et al.

(10) Patent No.: US 7,589,549 B2
(45) Date of Patent: Sep. 15, 2009

(54) DRIVER CIRCUIT AND TEST APPARATUS

(75) Inventors: Kensuke Kamo, Tokyo (JP); Takashi Sekino, Tokyo (JP); Toshiaki Awaji, Tokyo (JP)

(73) Assignee: Advantest Corporation, Tokyo (JP)

( * ) Notice: Subject to any disclaimer, the term of this patent is extended or adjusted under 35 U.S.C. 154(b) by 150 days.

(21) Appl. No.: 11/941,083

(22) Filed: Nov. 16, 2007

(65) Prior Publication Data

US 2009/0128181 A1 May 21, 2009

(51) Int. Cl.
*G01R 31/26* (2006.01)
(52) U.S. Cl. ........................ 324/765; 327/424
(58) Field of Classification Search ................. 324/765, 324/770, 158.1; 345/80; 327/108–111, 423–424
See application file for complete search history.

(56) References Cited

U.S. PATENT DOCUMENTS

| | | | |
|---|---|---|---|
| 5,936,456 A * | 8/1999 | Naka | 327/437 |
| 6,292,010 B1 | 9/2001 | Persons et al. | |
| 7,013,230 B2 * | 3/2006 | Sekino | 702/117 |
| 7,298,157 B2 * | 11/2007 | Kim | 324/765 |
| 7,409,615 B2 * | 8/2008 | Nishimine et al. | 714/734 |

* cited by examiner

*Primary Examiner*—Ha Tran T Nguyen
*Assistant Examiner*—Arleen M Vazquez
(74) *Attorney, Agent, or Firm*—Jianq Chyun IP Office (57) ABSTRACT

Provided is a driver circuit that includes a first operational mode and a second operational mode and outputs an output signal according to an input signal, including a first driver section that, in the first operational mode, generates and outputs the output signal according to the input signal and, in the second operational mode, outputs a power supply power having a predetermined voltage and a second driver section that, in the first operational mode, receives the output signal output by the first driver section and outputs the received signal to the outside and, in the second operational mode, generates the output signal according to the input signal and outputs the thus generated signal to the outside. The second driver section includes a first transistor that, in the second operational mode, generates the output signal by operating according to the input signal and receives the power supply power from the first driver section and a second transistor that, in the second operational mode, operates differentially with respect to the first transistor and receives the power supply power from the first driver section commonly with the first transistor.

9 Claims, 5 Drawing Sheets

DRIVER CIRCUIT AND TEST APPARATUS

BACKGROUND

1. Technical Field

The present invention relates to a driver circuit and a test apparatus. More particularly, the present invention relates to a driver circuit that outputs an output signal according to an input signal and a test apparatus that tests a device under test.

2. Related Art

A test apparatus that tests a device under test, such as a semiconductor device, is provided with a driver circuit that supplies a test signal to the device under test. Furthermore, the test apparatus is provided with a plurality of types of driver circuits and the type of driver circuit is selected according to the test signal to be supplied to the device under test.

In a case where a large amplitude test signal is supplied, the test apparatus selects, for example, a large amplitude driver circuit that includes a power amplifier that amplifies the power of the test signal. Furthermore, in a case where a high speed and high precision test signal is provided, the test apparatus selects, for example, a high speed driver circuit that includes a differential amplifier that differentially amplifies the test signal.

In a case where the large amplitude test signal and the high speed and high precision test signal can both be output from one output end, the test apparatus must be provided with a single driver circuit that includes the functions of both the large amplitude driver circuit and the high speed driver circuit. However, it is difficult to realize a single driver circuit that includes the functions of both the large amplitude driver circuit and the high speed driver circuit.

For example, realizing the large amplitude and high speed driver circuit by enlarging the amplitude of the output signal of the high speed driver circuit can be considered. To enlarge the amplitude of the output signal of the high speed driver circuit, one idea is to configure the differential amplifier to cause a large current to flow to the output resistor. Here, in a case where the differential amplifier causes the large current to flow to the output resistor, a transistor with a large voltage endurance for controlling a bias and connected serially to the output resistor must be provided.

However, the transistor having the large voltage endurance has a large collector capacity, which slows response speed. Therefore, when the amplitude of the output signal of the high speed driver circuit is enlarged, the response speed is undesirably slowed. Accordingly, it is difficult to realize the large amplitude and high speed driver circuit by enlarging the amplitude of the output signal of the high speed driver circuit.

On the other hand, realizing the large amplitude and high speed driver circuit by causing the large amplitude driver circuit to operate at a high speed can be considered. To cause the large amplitude driver circuit to operate at a high speed, one idea is to dispose the differential amplifier upstream from the power amplifier. However, in a case where the differential amplifier is disposed upstream from the large amplitude driver circuit, the amplitude of the output signal of the differential amplifier must be enlarged. When the differential amplifier is caused to operate with a large amplitude, the response speed of the output signal is slowed, as described above. Accordingly, it is difficult to realize the large amplitude and high speed driver circuit by causing the large amplitude driver circuit to operate at a high speed.

Furthermore, there are cases where the large amplitude driver circuit is provided with a class-AB power amplifier as the power amplifier. In such a case, the output impedance of the large amplitude driver circuit is undesirably changed according to a load current. Accordingly, it is difficult for the large amplitude driver circuit to supply an accurate output signal to the device under test.

SUMMARY

Therefore, it is an object of an aspect of the present invention to provide a driver circuit and a test apparatus, which are capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary apparatus may include a driver circuit that has a first operational mode and a second operational mode and outputs an output signal according to an input signal. The driver circuit includes a first driver section that, in the first operational mode, generates and outputs the output signal according to the input signal and, in the second operational mode, outputs a power supply power having a predetermined voltage and a second driver section that, in the first operational mode, receives the output signal output by the first driver section and outputs the received signal to the outside and, in the second operational mode, generates the output signal according to the input signal and outputs the thus generated signal to the outside. In the driver circuit, the second driver section includes a first transistor that, in the second operational mode, generates the output signal by operating according to the input signal and receives the power supply power from the first driver section and a second transistor that, in the second operational mode, operates differentially with respect to the first transistor and receives the power supply power from the first driver section commonly with the first transistor.

According to a second aspect related to the innovations herein, one exemplary apparatus may include a test apparatus for testing a device under test. The test apparatus includes a pattern generating section that generates a test pattern for testing the device under test, a driver circuit that has a first operational mode and a second operational mode and supplies a test signal according to the test pattern to the device under test, and a determining section that makes a judgment concerning pass/fail of the device under test based on a response signal output by the device under test according to the test signal. In the test apparatus, the driver circuit includes a first driver section that, in the first operational mode, generates and outputs the test signal according to the test pattern and, in the second operational mode, outputs a power supply power having a predetermined voltage and a second driver section that, in the first operational mode, receives the test signal output by the first driver section and supplies the received signal to the device under test and, in the second operational mode, generates the test signal according to the test pattern and supplies the thus generated signal to the device under test. In the driver circuit of the test apparatus, the second driver section includes a first transistor that, in the second operational mode, generates the test signal by operating according to the test pattern and receives the power supply power from the first driver section and a second transistor that, in the second operational mode, operates differentially with respect to the first transistor and receives the power supply power from the first driver section commonly with the first transistor.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
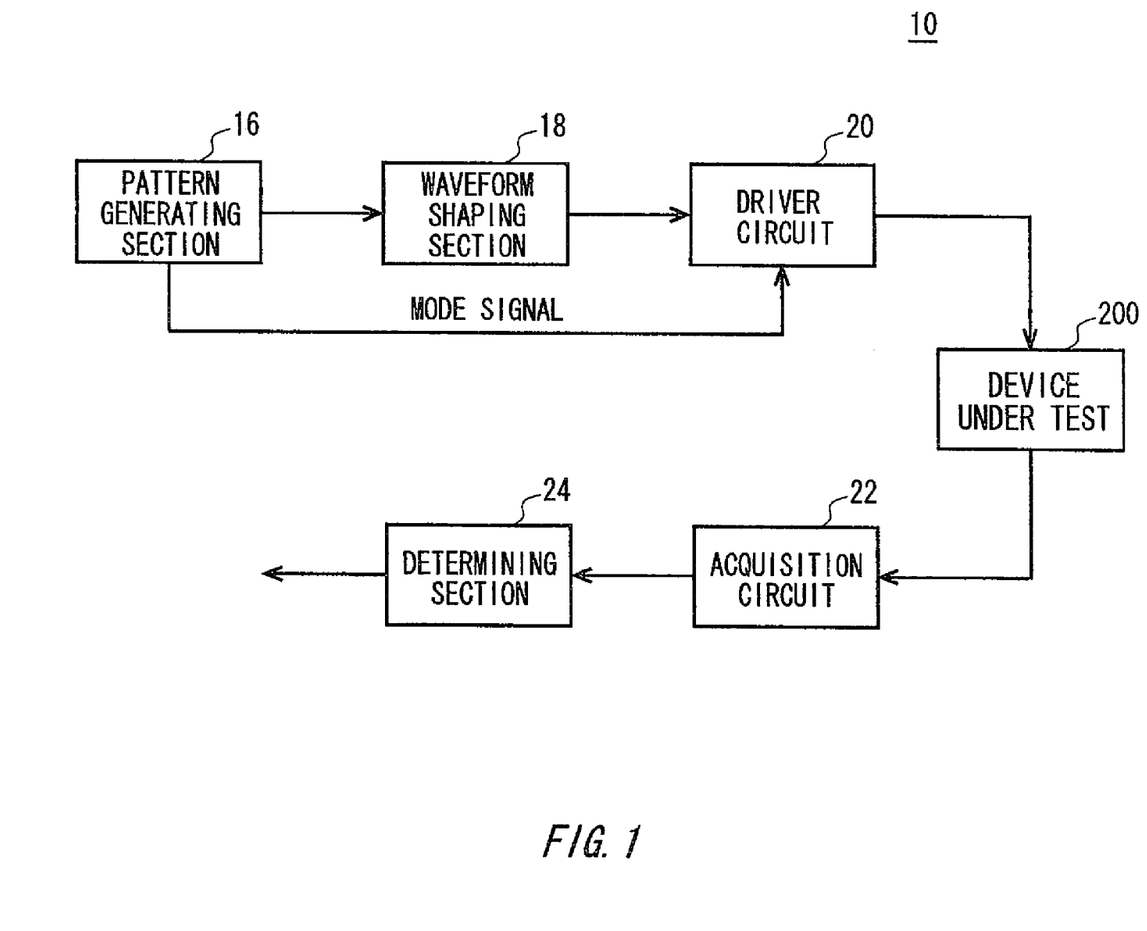
FIG. 1 shows a configuration of a test apparatus 10 along with a device under test 200 according to an embodiment of the present invention.

FIG. 1 shows a configuration of a test apparatus 10 along with a device under test 200 according to the present embodiment. The test apparatus 10 tests the device under test 200. The test apparatus 10 is provided with a pattern generating section 16, a waveform shaping section 18, a driver circuit 20, an acquisition circuit 22, and a determining section 24.

The pattern generating section 16 generates a test pattern for testing the device under test 200. The waveform shaping section 18 forms a waveform of the test signal according to the test pattern generated by the pattern generating section 16.

The driver circuit 20 supplies to the device under test 200 the test signal in which the waveform is formed according to the test pattern. Furthermore, the driver circuit 20 has a large amplitude operational mode as an example of a first operational mode according to the present invention and a high speed operational mode as an example of a second operational mode according to the present invention. For example, the driver circuit 20 may switch between the large amplitude operational mode and the high speed operational mode by receiving from the pattern generating section 16 a mode signal that designates the large amplitude operational mode or the high speed operational mode.

In the large amplitude operational mode, in comparison to the high speed operational mode, the driver circuit 20 can supply a test signal that has a larger amplitude to the device under test 200 with low energy consumption. In the high speed operational mode, in comparison to the large amplitude operational mode, the driver circuit 20 can provide a test signal to the device under test 200 at a higher speed and with greater precision.

The acquisition circuit 22 acquires a response signal output by the device under test 200 according to the test signal. The determining section 24 makes a judgment concerning pass/fail of the device under test 200 based on the response signal acquired by the acquisition circuit 22. The determining section 24 then outputs the judgment result to the outside.

Figure 2:
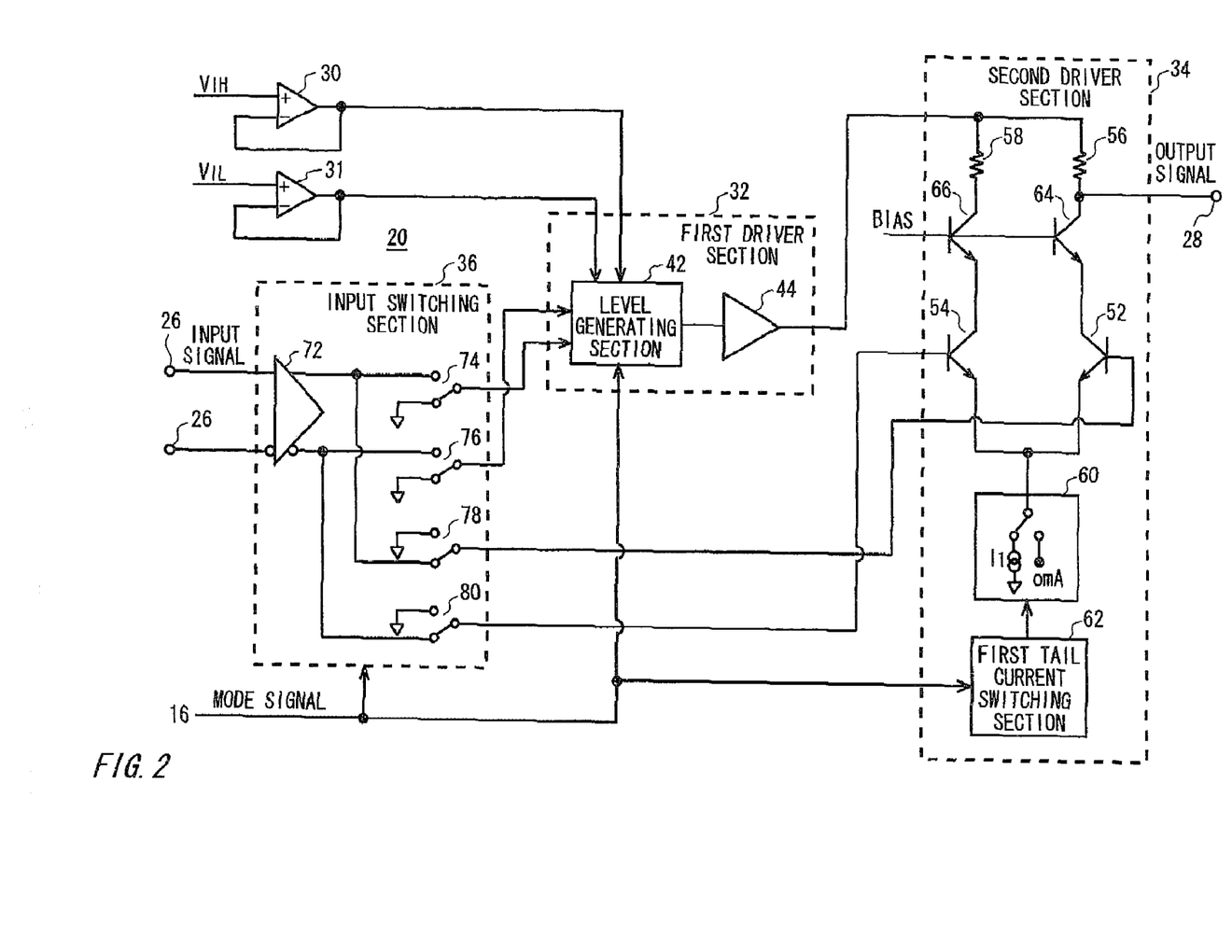
FIG. 2 shows a configuration of a driver circuit 20 according to an embodiment of the present invention.

FIG. 2 shows a configuration of the driver circuit 20 according to the present embodiment. The driver circuit 20 receives as an input signal via the input end 26 the test signal output by the waveform shaping section 18. For example, the driver circuit 20 may receive a differential input signal via the input end 26. The driver circuit 20 then outputs the output signal according to the input signal to the device under test 200 via the output end 28.

The driver circuit 20 is provided with a logic Logic H input buffer 30, a logic Logic L input buffer 31, a first driver section 32, a second driver section 34, and an input switching section 36. The logic Logic H input buffer 30 outputs a voltage $V_{IH}$ that indicates a logic H level of the test signal. The logic Logic L input buffer 31 outputs a voltage $V_{IL}$ that indicates a logic L level of the test signal.

In the large amplitude operational mode, the first driver section 32 generates and outputs the output signal according to the input signal. For example, in the large amplitude operational mode, the first driver section 32 may generate and output the output signal that includes a voltage according to the logic of the input signal. In other words, in the large amplitude operational mode, the first driver section 32 may output the output signal that has the logic H level voltage in a case where the input signal is logic H and may output the output signal that has the logic L level voltage in a case where the input signal is logic L.

Furthermore, in the high speed operational mode, the first driver section 32 outputs a power supply power having a predetermined voltage. For example, in the high speed operational mode, the first driver section 32 may output a power supply power having a voltage that is logic H level.

The first driver section 32 includes a level generating section 42 and an amplifying section 44, for example. The level generating section 42 receives the power supply power having the predetermined voltage. For example, the level generating section 42 may receive the voltage having the logic H level from the logic Logic H input buffer 30 and may receive the voltage having the logic H level from the logic Logic L input buffer 31.

In the large amplitude operational mode, the level generating section 42 outputs a signal that has a pattern according to the input signal. For example, in the large amplitude operational mode, the first driver section 32 may output a signal that has a voltage according to the logic of the input signal.

In the high speed operational mode, the level generating section 42 outputs the predetermined voltage. For example, in the high speed operational mode, the level generating section 42 may output a voltage having the logic H level.

The amplifying section 44 power amplifies and outputs the signal output by the level generating section 42. In other words, in the large amplitude operational mode, the amplifying section 44 power amplifies and outputs the signal that has a pattern according to the input signal. Furthermore, in the high speed operational mode, the amplifying section 44 power amplifies and outputs the predetermined voltage.

The amplifying section 44 then supplies the power amplified signal to the second driver section 34. More specifically, the amplifying section 44 causes the output resistor 56 (described hereinafter) and the parallel resistor 58 (described hereinafter) of the second driver section 34 to be connected in parallel to the output end. The amplifying section 44 then outputs the power amplified signal to the output resistor 56 and the parallel resistor 58.

In the large amplitude operational mode, the first driver section 32 described above functions as a power amplifier that outputs an output signal obtained by power amplifying the input signal. Furthermore, in the high speed operational mode, the first driver section 32 functions as a voltage source that outputs a power supply power that has the predetermined voltage.

In the large amplitude operational mode, the second driver section 34 receives the output signal output by the first driver section 32. The second driver section 34 then outputs the received output signal to the outside via the output end 28. In other words, in the large amplitude operational mode, the second driver section 34 outputs to the outside an output signal obtained by power amplification of the input signal by the first driver section 32. Furthermore, in the high speed operational mode, the second driver section 34 receives the predetermined voltage output by the first driver section 32 as the power supply power, generates an output signal according to the input signal by differential amplification, and outputs the thus generated output signal to the outside.

The second driver section 34 includes a first transistor 52, a second transistor 54, the output resistor 56, the parallel resistor 58, a first tail current source 60, a first tail current switching section 62, a first bias transistor 64, and a second bias transistor 66. In the high speed operational mode, the first transistor 52 receives the power supply power from the first driver section 32 and generates the output signal by performing a switching operation according to the input signal.

For example, the first transistor 52 may be a bipolar transistor in which the collector terminal is connected to a power source side (an output end side of the first driver section 32) and the emitter terminal is connected on a grounded side. In such a case, the bipolar transistor serving as the first transistor 52 may receive the input signal in the base terminal, perform switching at the collector-emitter junction, and output the output signal from the collector terminal side. Furthermore, for example, the first transistor 52 may perform the switching operation according to either the non-inverted signal or the inverted signal of the differential input signal.

In the high speed operational mode, the second transistor 54 receives the power supply power from the first driver section 32 commonly with the first transistor 52 and performs the switching operation differentially with respect to the first transistor 52. For example, the second transistor 54 may be a bipolar transistor with the same characteristics as the first transistor 52 in which the collector terminal is connected to a power source side (an output end side of the first driver section 32) and the emitter terminal is connected on a grounded side. In such a case, the bipolar transistor serving as the second transistor 54 may receive the inverted signal of the input signal in the base terminal and perform switching at the collector-emitter junction. For example, the second transistor 54 may perform the switching operation according to whichever of either the non-inverted signal or the inverted signal of the differential input signal is not supplied to the first transistor 52.

The output resistor 56 is disposed between an output terminal of the first transistor 52 (for example, the collector terminal) and the output end of the first driver section 32. An end node of the output resistor 56 on a first transistor 52 side is connected to the output end 28. The parallel resistor 58 is disposed between an output terminal of the second transistor 54 (for example, the collector terminal) and the output end of the first driver section 32. The parallel resistor 58 has substantially the same impedance as the output resistor 56.

The first tail current source 60 is commonly connected to the first transistor 52 and the second transistor 54 and regulates the aggregate current flowing to the first transistor 52 and the second transistor 54. The first tail current source 60 is commonly connected to the ground terminals (for example, the emitter terminals) of the first transistor 52 and the second transistor 54 and regulates the aggregate of the current flowing to the first transistor 52 (for example, the emitter junction current) and the current flowing to the second transistor 54 (for example, the emitter junction current).

In the large amplitude operational mode, the first tail current switching section 62 controls the current flowing to the first tail current source 60 to be substantially zero (for example, 0 mA). In other words, in the large amplitude operational mode, the first tail current switching section 62 controls the aggregate current flowing to the first transistor 52 and the second transistor 54 to be substantially zero.

In the high speed operational mode, the first tail current switching section 62 controls the current flowing to the first tail current source 60 to be a predetermined constant current value (for example, $I_1a$). In other words, in the high speed operational mode, the first tail current switching section 62 controls the aggregate of the current flowing to the first transistor 52 and the second transistor 54 (for example, the emitter current) to be the predetermined current.

The first bias transistor 64 is disposed by being inserted between the output terminal of the first transistor 52 (for example, the collector terminal) and the output resistor 56. For example, the first bias transistor 64 may be a bipolar transistor in which the emitter terminal is connected to the output terminal of the first transistor 52 (for example, the collector terminal) and the collector terminal is connected to output resistor 56. A fixed bias voltage is applied to an input terminal (for example, the base terminal) of the first bias transistor 64 to set a prescribed voltage between the output terminal of the first transistor 52 and the output resistor 56. The first bias transistor 64 described above can regulate the voltage applied to the first transistor 52 to be within the voltage endurance specifications of the first transistor 52. Here, the first bias transistor 64 may be disposed by being inserted between the ground terminal (for example, the emitter terminal) of the first transistor 52 and the first tail current source 60, for example.

The second bias transistor 66 is disposed by being inserted between the output terminal of the second transistor 54 (for example, the collector terminal) and the parallel resistor 58. For example, the second bias transistor 66 may be a bipolar transistor that has the same characteristics as the first transistor 52 and in which the emitter terminal is connected to the output terminal of the second transistor 54 (for example, the collector terminal) and the collector terminal is connected to the parallel resistor 58. A fixed bias voltage, which is the same as the fixed bias voltage supplied to the first bias transistor 64, is applied to an input terminal (for example, the base terminal) of the second bias transistor 66 to set a prescribed voltage between the output terminal of the second transistor 54 and the parallel resistor 58. The second bias transistor 66 described above can regulate the voltage applied to the second transistor 54 to be within the voltage endurance specifications of the second transistor 54. Here, the second bias transistor 66 may be disposed by being inserted between the ground terminal (for example, the emitter terminal) of the second transistor 54 and the first tail current source 60, for example.

The second driver section 34 outputs as the output signal via the output end 28 the voltage at an end node of the output resistor 56 on the first transistor 52 side. In the large amplitude operational mode, in the second driver section 34 having the configuration described above, the aggregate current flowing to the first transistor 52 and the second transistor 54 is controlled to be zero. Accordingly, in the large amplitude operational mode, the second driver section 34 can receive the output signal output by the first driver section 32 and output the received signal to the outside via the output resistor 56. In other words, in the large amplitude operational mode, the second driver section 34 functions as a resistor disposed between the first driver section 32 and the output end 28.

Furthermore, in the high speed operational mode, in the second driver section 34 having the configuration described above, the aggregate current flowing to the first transistor 52 and the second transistor 54 is controlled to be the predetermined current value. Then, in the second driver section 34, the first transistor 52 and the second transistor 54 perform switching according to the input signal differentially in relation to each other. Accordingly, in the high speed operational mode, the second driver section 34 functions as a differential amplifier that receives the power supply power from the first driver section 32, generates an output signal according to the input signal by differential amplification, and outputs the thus generated output signal to the outside via the output end 28.

Furthermore, because the second driver section 34 having the configuration described above functions as the differential amplifier in the high speed operational mode, the current made to flow out from the first driver section 32 to the ground potential can be set to be constant regardless of the logic of the output signal. Accordingly, even in a case where the amplifying section 44 of the first driver section 32 is made up of a class-B power amplifier or a class-AB power amplifier, the second driver section 34 can set the output impedance of the amplifying section 44 to be constant because the current output from the amplifying section 44 is substantially constant.

Here, the synthetic resistance of the output impedance of the first driver section 32 in the high speed operational mode and the output resistor 56 may be substantially the same as a resistance value of a transmission path between the load (device under test 200) and the output end 28 (for example, 50Ω). Therefore, the driver circuit 20 can match the output impedance of the driver circuit 20 as seen from the output end 28 to the transmission path impedance of the device under test 200 as seen from the output end 28.

The first tail current switching section 62 may, for example, set the current value flowing to the first tail current source 60 in the high speed operational mode based on a difference between a voltage level at a time when the output signal indicates logic H (logic H level) and a voltage level at a time when the output signal indicates logic L (logic L level). In a case where the voltage having the logic H level is output from the first driver section 32, the first tail current switching section 62 may set a current value obtained by dividing the potential difference between the logic H level and the logic L level by the resistance value of the output resistor 56, for example, as the current value flowing to the first tail current source 60 in the high speed operational mode. Therefore, in the high speed operational mode, the second driver section 34 can set the voltage value of the output end 28 to be logic H level when the first transistor 52 is turned off and can set the voltage value of the output end 28 to be logic L level when the first transistor 52 is turned on.

In the large amplitude operational mode, the input switching section 36 supplies the input signal to the first driver section 32 and stops the supply of the input signal to the second driver section 34. Furthermore, in the high speed operational mode, the input switching section 36 supplies the input signal to the second driver section 34 and stops the supply of the input signal to the first driver section 32. For example, in the large amplitude operational mode, the input switching section 36 may supply a control voltage that turns off the first transistor 52 and the second transistor 54 to the input terminals (for example, the base terminals) of the first transistor 52 and the second transistor 54. During the high speed operational mode, the input switching section 36 supplies a control voltage according to the input signal to the input terminals (for example, the base terminals) of the first transistor 52 and the second transistor 54, for example.

The input switching section 36 may include, for example, a differential buffer 72, a first positive switch 74, a first negative switch 76, a second positive switch 78, and a second negative switch 80. The differential buffer 72 receives the differential input signal and outputs a non-inverted control voltage and an inverted control voltage according to the differential input signal.

In the large amplitude operational mode, the first positive switch 74 supplies the non-inverted control voltage to the level generating section 42, and in the high speed operational mode, the first positive switch 74 supplies the ground potential to the level generating section 42. In the large amplitude operational mode, the first negative switch 76 supplies the inverted control voltage to the level generating section 42, and in the high speed operational mode, the first positive switch 74 supplies the ground potential to the level generating section 42.

In the large amplitude operational mode, the second positive switch 78 supplies the ground potential to the input terminal of the first transistor 52, and in the high speed operational mode, the second positive switch 78 supplies the non-inverted control voltage to the input terminal of the first transistor 52. In the large amplitude operational mode, the second negative switch 80 supplies the ground potential to the input terminal of the second transistor 54, and in the high speed operational mode, the second negative switch 80 supplies the inverted control voltage to the input terminal of the second transistor 54.

In the manner described above, in the large amplitude operational mode, the input switching section 36 can supply the control voltage that turns off the first transistor 52 and the second transistor 54 to the input terminals of the first transistor 52 and the second transistor 54. Also in the manner described above, in the high speed operational mode, the input switching section 36 can supply the control voltage according to the input signal to the input terminals of the first transistor 52 and the second transistor 54.

In the driver circuit 20 described above, in the large amplitude operational mode, the first driver section 32 functions as a power amplifier that outputs the output signal obtained by power amplifying the input signal. Furthermore, in the driver circuit 20 described above, in the large amplitude operational mode, the second driver section 34 functions as an output resistor. Accordingly, through the driver circuit 20, in the large amplitude operational mode, an output signal having a large amplitude can be supplied to the load (device under test 200) with little power in comparison to a case where the driver circuit 20 is caused to operate in the high speed operational mode.

Furthermore, in the high speed operational mode, the driver circuit 20 functions as a voltage source in which the first driver section 32 provides the power supply power having the predetermined voltage to the second driver section 34. In the high speed operational mode, the driver circuit 20 functions as a differential amplifier in which the second driver section 34 outputs the output signal obtained by differentially amplifying the input signal. Accordingly, through the driver circuit 20, in the high speed operational mode, a high speed output signal can be supplied to the load (device under test 200) in comparison to a case where the driver circuit 20 is caused to operate in the large amplitude operational mode.

Yet further, in the high speed operational mode, the current flowing from the first driver section 32 to the second driver section 34 is substantially constant regardless of the logic of the output signal. Accordingly, even in a case where the amplifying section 44 is made up of the class-B power amplifier or the class-AB power amplifier, the first driver section 32 causes the output impedance to be constant. Accordingly, in the high speed operational mode, the driver circuit 20 can supply an output signal having high precision in comparison to a case where the driver circuit 20 is caused to operate in the large amplitude operational mode because the output impedance as seen from the output end 28 is constant.

Through the driver circuit 20 as described above, a single output end 28 can switch between outputting an output signal having a larger amplitude using less power and an output signal that is high speed and high precision. Furthermore, in the driver circuit 20, the first driver section 32 includes the functions of both a power amplifier and a voltage source. Accordingly, through the driver circuit 20, the overall circuit size can be decreased because the power amplifier and the voltage source are realized in a single circuit.

Figure 3:
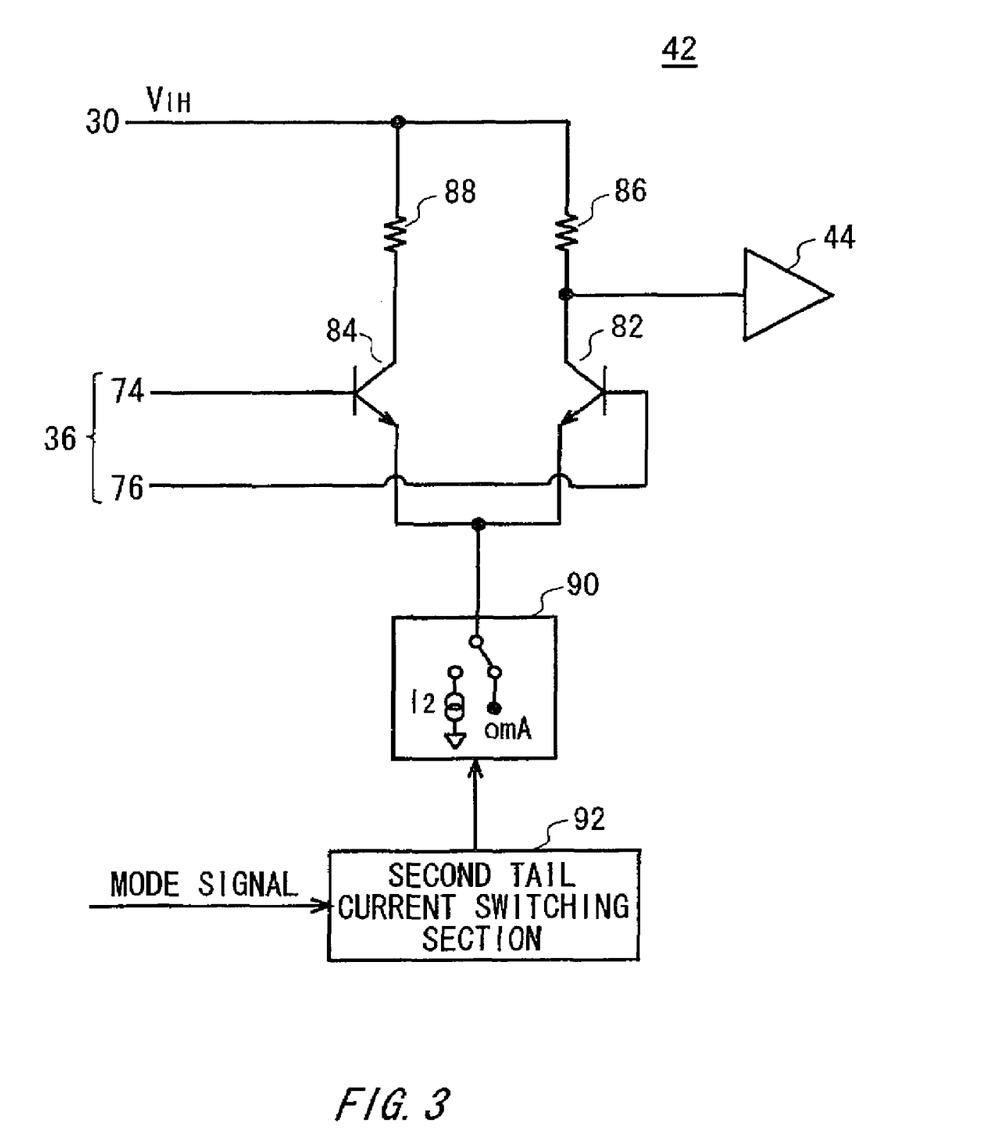
FIG. 3 shows an exemplary configuration of a level generating section 42 along with an amplifying section 44 according to an embodiment of the present invention.

FIG. 3 shows an exemplary configuration of the level generating section 42 along with the amplifying section 44 according to the present embodiment. The level generating section 42 may include a third transistor 82, a fourth transistor 84, a first resistor 86, a second resistor 88, a second tail current source 90, and a second tail current switching section 92, for example. The level generating section 42 may be supplied with a power supply voltage having a logic H level from the logic Logic H input buffer 30, for example.

In the large amplitude operational mode, the third transistor 82 generates the output signal by performing the switching operation according to the input signal and supplies the generated signal to the amplifying section 44. For example, the third transistor 82 may operate by receiving the power supply power from the logic Logic H input buffer 30. Furthermore, in the high speed operational mode, the third transistor 82 is controlled to be turned off. As a result, the third transistor 82 can supply to the amplifying section 44 the power supply voltage supplied from the logic Logic H input buffer 30.

The third transistor 82 may be, for example, a bipolar transistor in which the collector terminal is grounded on a power supply voltage side, the emitter terminal is connected to the grounded side, and the output signal is taken from a collector terminal side. In the large amplitude operational mode, the third transistor 82 may receive the input signal at the base terminal and perform switching at the collector-emitter junction. Furthermore, in the high speed operational mode, the third transistor 82 may receive at the base terminal the control voltage that turns off the collector-emitter junction.

In the large amplitude operational mode, the fourth transistor 84 performs switching differentially with respect to the third transistor 82. For example, the fourth transistor 84 may operate by receiving the power supply power commonly with the third transistor 82. In the high speed operational mode, the fourth transistor 84 is controlled to be turned off.

The fourth transistor 84 may be, for example, a bipolar transistor having the same characteristics as the third transistor 82 and in which the collector terminal is grounded on the power supply voltage side and the emitter terminal is connected to the grounded side. In the large amplitude operational mode, the fourth transistor 84 may receive the inverted signal of the input signal at the base terminal and perform switching at the collector-emitter junction. In the high speed operational mode, the fourth transistor 84 may receive at the base terminal the control voltage that turns off the collector-emitter junction.

The first resistor 86 is disposed between the output terminal (for example, the collector terminal) of the third transistor 82 and the power supply voltage (for example, the output end of the logic Logic H input buffer 30). An end node of the first resistor 86 on a third transistor 82 side is connected to the input end of the amplifying section 44. The second resistor 88 is disposed between the output terminal (for example, the collector terminal) of the fourth transistor 84 and the power supply voltage (for example, the output end of the logic Logic H input buffer 30). The second resistor 88 has substantially the same impedance as the first resistor 86.

The second tail current source 90 is commonly connected to the third transistor 82 and the fourth transistor 84 and regulates the aggregate current flowing to the third transistor 82 and the fourth transistor 84. The second tail current source 90 is commonly connected to the ground terminals (for example, the emitter terminals) of the third transistor 82 and the fourth transistor 84 and regulates the aggregate of the current flowing to the third transistor 82 (for example, the emitter junction current) and the current flowing to the fourth transistor 84 (for example, the emitter junction current).

In the large amplitude operational mode, the second tail current switching section 92 regulates the current flowing to the second tail current source 90 to be a predetermined constant current value (for example, $I_2A$). In other words, in the large amplitude operational mode, the second tail current switching section 92 controls the aggregate of the current flowing to the third transistor 82 and the fourth transistor 84 to be the predetermined current.

In the high speed operational mode, the second tail current switching section 92 controls the current flowing to the second tail current source 90 to be substantially zero (for example, 0 mA). In other words, in the high speed operational mode, the second tail current switching section 92 controls the aggregate voltage flowing to the third transistor 82 and the fourth transistor 84 to be substantially zero.

In the level generating section 42 having the configuration described above, the aggregate current flowing to the third transistor 82 and the fourth transistor 84 becomes the predetermined current value in the large amplitude operational mode. Accordingly, in the large amplitude operational mode, the level generating section 42 functions as a differential amplifier that generates an output signal according to the input signal by differential amplification and outputs the thus generated output signal to the amplifying section 44.

Furthermore, in the level generating section 42 having the configuration described above, the aggregate current flowing to the third transistor 82 and the fourth transistor 84 becomes zero in the high speed operational mode. Accordingly, in the high speed operational mode, the level generating section 42 can receive the power supply voltage from the logic Logic H input buffer 30 and supply the received voltage to the amplifying section 44 via the first resistor 86. In other words, in the high speed operational mode, the level generating section 42 can function as a voltage source.

Here, in the high speed operational mode, the input switching section 36 may, for example, supply the control voltage that turns off the third transistor 82 and the fourth transistor 84 to the input terminals (for example, the base terminals) of the third transistor 82 and the fourth transistor 84 to the level generating section 42 having the configuration described above. Therefore, in the high speed operational mode, the third transistor 82 and the fourth transistor 84 are controlled to be turned off.

Furthermore, in the large amplitude operational mode, the input switching section 36 may, for example, supply the control voltage according to the input signal to the input terminals (for example, the base terminals) of the third transistor 82 and the fourth transistor 84. Therefore, in the large amplitude operational mode, the third transistor 82 and the fourth transistor 84 can perform the switching operation according to the input signal.

Figure 4:
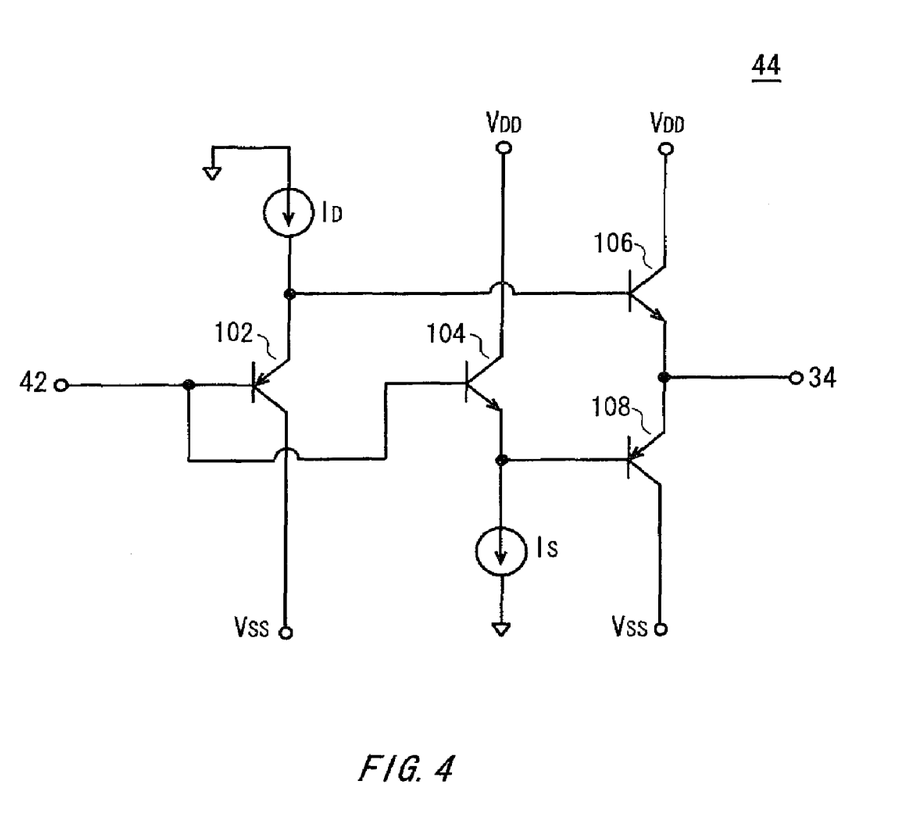
FIG. 4 shows an exemplary configuration of the amplifying section 44 according to an embodiment of the present invention.

FIG. 4 shows an exemplary configuration of the amplifying section 44 according to the present embodiment. The amplifying section 44 may include a first pnp transistor 102, a first npn transistor 104, a second npn transistor 106, and a second pnp transistor 108, for example.

In the first pnp transistor 102, the base terminal receives the signal output from the level generating section 42, the emitter terminal is connected to a current source that causes a predetermined current $I_D$ to flow out, and the collector terminal is connected to a sink voltage source $V_{SS}$. In the first npn transistor 104, the base terminal receives the signal output by the level generating section 42, the emitter terminal is connected to a current source that causes a predetermined current $I_S$ to flow in, and the collector terminal is connected to a source voltage source $V_{DD}$.

In the second npn transistor 106, the base terminal is connected to the emitter terminal of the first pnp transistor 102, the collector terminal is connected to the source voltage source $V_{DD}$, and the emitter terminal is connected to emitter terminal of the second pnp transistor 108. In the second pnp transistor 108, the base terminal is connected to the emitter terminal of the first npn transistor 104 and the collector terminal is connected to the sink voltage source $V_{SS}$.

The amplifying section 44 connected in the manner described above outputs the signal from the emitter terminals of the second npn transistor 106 and the second pnp transistor 108 to the second driver section 34 downstream from the second npn transistor 106 and the second pnp transistor 108. The amplifying section 44 having the configuration described above functions as a class-AB power amplifier. Therefore, through the amplifying section 44, the signal output by the level generating section 42 is power amplified and supplied to the second driver section 34.

Figure 5:
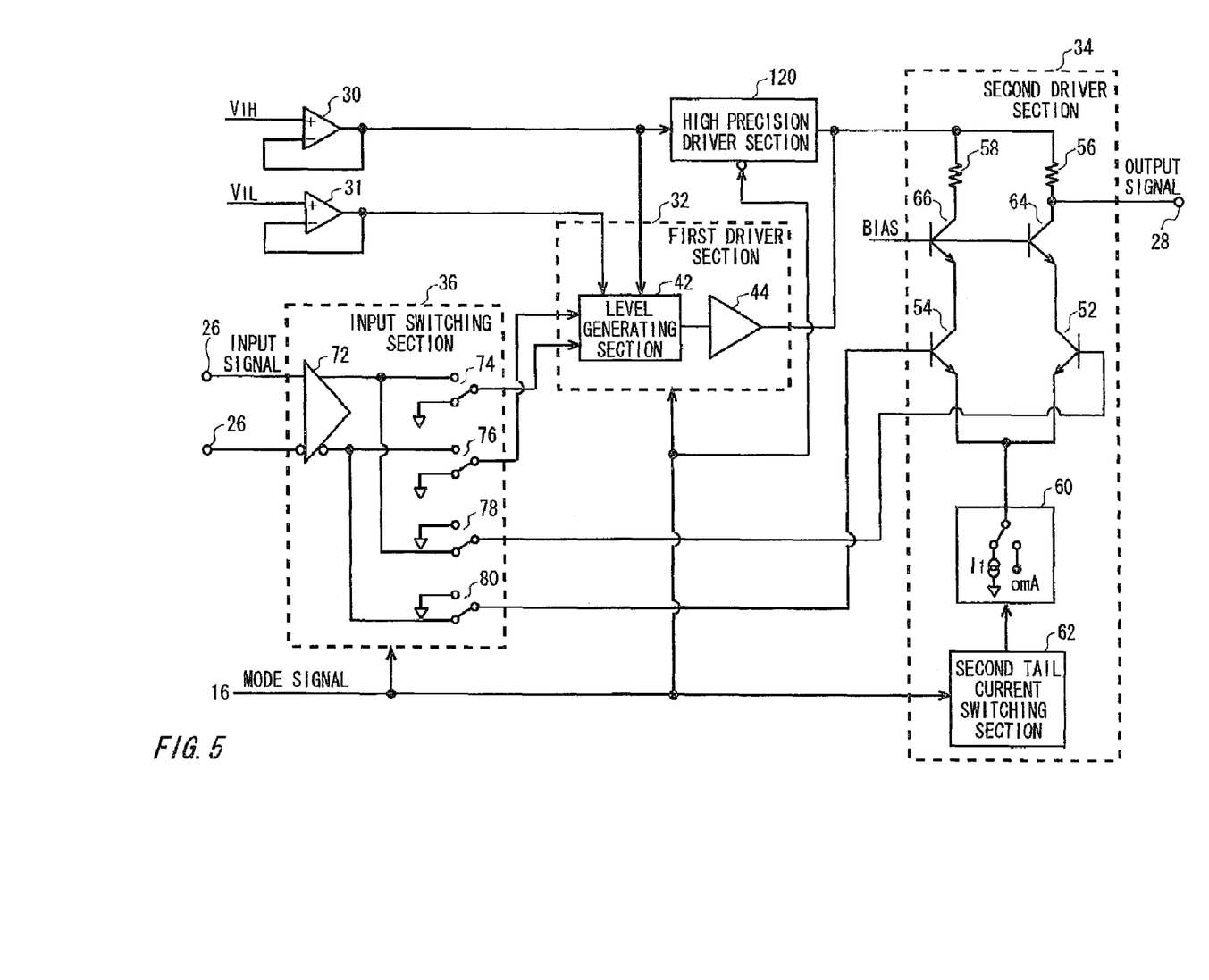
FIG. 5 shows an example of a configuration of the driver circuit 20 according to a modification of an embodiment of the present invention.

FIG. 5 shows a configuration of the driver circuit 20 according to a modification of the present embodiment. In the driver circuit 20 according to the present modification, substantially the same configuration and function as the components having the same reference numerals shown in FIG. 2 are adopted, and therefore components having substantially the same configuration and function as the components shown in FIG. 2 are given the same reference numerals and the following description omits all but different points.

The driver circuit 20 according to the present modification is further provided with a high precision driver section 120. In the large amplitude operational mode, the high precision driver section 120 is controlled to be disabled. For example, in the large amplitude operational mode, an output end of the high precision driver section 120 may be controlled to be high impedance.

Furthermore, in the high speed operational mode, the high precision driver section 120 outputs the power supply power having the predetermined voltage. For example, in the high speed operational mode, the high precision driver section 120 may receive the voltage having a logic H level from the logic Logic H input buffer 30 and output the power supply power that has a logic H level voltage.

In the large amplitude operational mode, the first driver section 32 generates and outputs the output signal according to the input signal. The level generating section 42 inside the first driver section 32 may, for example, receive the voltage having a logic H level from the logic Logic H input buffer 30, receive the voltage having a logic L level from the logic Logic L input buffer 31, and switch according to the input signal to output the voltage having logic H level or the voltage having logic L level.

Furthermore, in the high speed operational mode, the first driver section 32 is controlled to be disabled. For example, in the high speed operational mode, the output end of the first driver section 32 may be controlled to be high impedance. In addition, the output terminal of the first driver section 32 and the output terminal of the high precision driver section 120 are connected to the same input terminal in the second driver section 34.

In the large amplitude operational mode, the second driver section 34 described above receives the output signal output by the first driver section 32 and outputs the received signal to the outside. Furthermore, in the high speed operational mode, the second driver section 34 receives the power supply power from the high precision driver section 120, generates the output signal according to the input signal, and outputs the thus generated signal to the outside.

In other words, in the high speed operational mode, the first transistor 52 receives the power supply power from the high precision driver section 120 and generates the output signal by operating according to the input signal. In the high speed operational mode, the second transistor 54 receives the power supply power from the high precision driver section 120 commonly with the first transistor 52 and operates differentially with respect to the first transistor 52. The output resistor 56 is disposed between the output terminal (for example, the collector terminal) of the first transistor 52 and the output terminals of the driver section 120 and the first driver section 32. The parallel resistor 58 is disposed between the output terminal (for example, the collector terminal) of the second transistor 54 and the output terminals of the driver section 120 and the first driver section 32, for example.

Through the test apparatus 10 according to the modification described above, in the same manner as the driver circuit 20 shown in FIG. 2, a single output end 28 can switch between outputting an output signal having a larger amplitude using less power and an output signal that is high speed and high precision. Here, it is desirable that the high precision driver section 120 have an output level error that is less than the first driver section 32. Therefore, through the driver circuit 20, in the high speed operational mode, an output signal can be output with higher precision in comparison to the large amplitude operational mode.

Furthermore, it is desirable that the output capacity of the high precision driver section 120 in a disabled condition be smaller than the output capacity of the first driver section 32 in the disabled condition. Therefore, through the driver circuit 20, in the large amplitude operational mode, the effect exerted on the output signal by the high precision driver section 120 can be minimized.

Yet further, it is desirable that the current amount that can be output by the high precision driver section 120 be less than the current amount that can be output by the first driver section 32. Therefore, through the driver circuit 20, the circuit size of the high precision driver section 120 can be minimized.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A driver circuit that has a first operational mode and a second operational mode and outputs an output signal according to an input signal, comprising:
   a first driver section that, in the first operational mode, generates and outputs the output signal according to the input signal and, in the second operational mode, outputs a power supply power having a predetermined voltage; and
   a second driver section that, in the first operational mode, receives the output signal output by the first driver section and outputs the received signal to the outside and, in the second operational mode, generates the output signal according to the input signal and outputs the thus generated signal to the outside, wherein the second driver section includes,
   a first transistor that, in the second operational mode, generates the output signal by operating according to the input signal and receives the power supply power from the first driver section; and
   a second transistor that, in the second operational mode, operates differentially with respect to the first transistor and receives the power supply power from the first driver section commonly with the first transistor.

2. The driver circuit according to claim 1, wherein the second driver section further includes:
   an output resistor disposed between an output terminal of the first transistor and the first driver section; and
   a parallel resistor, which has an impedance that is substantially the same as that of the output resistor, disposed between an output terminal of the second transistor and the first driver section, and the second driver section outputs as the output signal a voltage at an end node of the output resistor on a first transistor side.

3. The driver circuit according to claim 2, wherein the second driver section further includes:
   a first tail current source, which is connected commonly to the first transistor and the second transistor, that regulates an aggregate current flowing to the first transistor and the second transistor; and
   a first tail current switching section that, in the first operational mode, controls a current flowing to the first tail current source to be substantially zero and, in the second operational mode, controls the current flowing to the first tail current source to be a predetermined constant current value.

4. The driver circuit according to claim 3, further comprising an input switching section that, in the first operational mode, supplies a control voltage that turns off the first transistor and the second transistor to input terminals of the first transistor and the second transistor and, in the second operational mode, supplies the control voltage according to the input signal to the input terminals of the first transistor and the second transistor.

5. The driver circuit according to claim 4, wherein the first driver section includes:
   a level generating section that receives a power supply power having a predetermined voltage, outputs a signal having a pattern according to the input signal in the first operational mode, and outputs the predetermined voltage in the second operational mode; and
   an amplifying section, which has an output end thereof to which the output resistor and the parallel resistor of the second driver section are connected in parallel, that power amplifies the signal output by the level generating section and outputs the thus amplified signal.

6. The driver circuit according to claim 5, wherein the level generating section includes:
   a third transistor that, in the first operational mode, generates the output signal by operating according to the input signal and supplies the thus generated signal to the amplifying section and, in the second operational mode, is controlled to be turned off and supplies a supplied power supply voltage to the amplifying section;
   a fourth transistor that, in the first operational mode, operates differentially with respect to the third transistor and, in the second operational mode, is controlled to be turned off;
   a second tail current source, which is commonly connected to the third transistor and the fourth transistor, that regulates an aggregate current flowing to the third transistor and the fourth transistor; and
   a second tail current switching section that, in the second operational mode, controls a current flowing to the second tail current source to be substantially zero and, in the first operational mode, controls the current flowing to the second tail current source to be a predetermined constant current value.

7. The driver circuit according to claim 6, wherein the input switching section, in the second operational mode, supplies a control voltage that turns off the third transistor and the fourth transistor to input terminals of the third transistor and the fourth transistor and, in the first operational mode, supplies the control voltage according to the input signal to the input terminals of the third transistor and the fourth transistor.

8. The driver circuit according to claim 4, wherein the second driver section includes transistors having input terminals into which a fixed bias voltage is applied disposed between the first transistor and the output resistor and between the second transistor and the parallel resistor, respectively.

9. A test apparatus for testing a device under test, comprising:
   a pattern generating section that generates a test pattern for testing the device under test;
   a driver circuit that has a first operational mode and a second operational mode and supplies a test signal according to the test pattern to the device under test; and
   a determining section that makes a judgment concerning pass/fail of the device under test based on a response signal output by the device under test according to the test signal, wherein the driver circuit includes,
   a first driver section that, in the first operational mode, generates and outputs the test signal according to the test pattern and, in the second operational mode, outputs a power supply power having a predetermined voltage; and
   a second driver section that, in the first operational mode, receives the test signal output by the first driver section and supplies the received signal to the device under test and, in the second operational mode, generates the test signal according to the test pattern and supplies the thus generated signal to the device under test, wherein the second driver section includes,
   a first transistor that, in the second operational mode, generates the test signal by operating according to the test pattern and receives the power supply power from the first driver section; and
   a second transistor that, in the second operational mode, operates differentially with respect to the first transistor and receives the power supply power from the first driver section commonly with the first transistor.

* * * * *